United States Patent
Seong et al.

(10) Patent No.: US 11,768,637 B2
(45) Date of Patent: *Sep. 26, 2023

(54) INTERFACE CIRCUIT AND SYSTEM INCLUDING SAME

(71) Applicant: SAMSUNG ELECTRONICS CO., LTD., Suwon-si (KR)

(72) Inventors: Kihwan Seong, Hwaseong-si (KR); Donguk Park, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/721,497

(22) Filed: Apr. 15, 2022

(65) Prior Publication Data

US 2022/0236924 A1 Jul. 28, 2022

Related U.S. Application Data

(63) Continuation of application No. 17/198,383, filed on Mar. 11, 2021, now Pat. No. 11,314,462.

(30) Foreign Application Priority Data

Aug. 21, 2020 (KR) .................. 10-2020-0105537

(51) Int. Cl.
   *G06F 3/06* (2006.01)
   *G11C 7/22* (2006.01)
   *G11C 7/10* (2006.01)

(52) U.S. Cl.
   CPC ............ *G06F 3/0683* (2013.01); *G11C 7/109* (2013.01); *G11C 7/1063* (2013.01); *G11C 7/22* (2013.01); *G06F 3/0656* (2013.01)

(58) Field of Classification Search
   CPC ... G06F 3/0683; G06F 3/0656; G11C 7/1063; G11C 7/109; G11C 7/22; G11C 7/1006; G11C 7/1084; G11C 7/222; G11C 29/022; G11C 29/028; H04L 25/0264; H04L 25/03; H04W 4/70

(Continued)

(56) References Cited

U.S. PATENT DOCUMENTS 6,801,054 B2    10/2004  Hirano
7,199,615 B2     4/2007  Stojanovic et al.

(Continued)

FOREIGN PATENT DOCUMENTS

WO    WO2016081192 A1      5/2016
WO    WO-2017149980 A1  *  9/2017  ......... G06F 13/4063

*Primary Examiner* — Fernando Hidalgo
(74) *Attorney, Agent, or Firm* — Fish & Richardson P.C.

(57) ABSTRACT

An interface circuit includes; a transmitter interface circuit including an output pad and configured to receive a first input data signal and generate a second input data signal from the first input data signal, and a receiver interface circuit including an input pad and configured to receive the second input data signal via the output pad and an internal channel. The transmitter interface circuit also includes an equalization signal generation circuit configured to receive the first input data signal, generate a pulse signal by delaying the first input data signal by applying a target delay time or a target width adjustment to the first input data signal, generate an equalization signal based on the pulse signal, and provide the equalization signal to the output pad to suppress a reflected wave on the internal channel.

19 Claims, 18 Drawing Sheets

(58) Field of Classification Search
USPC .......................................................... 711/111
See application file for complete search history.

(56) References Cited

U.S. PATENT DOCUMENTS

| | | | |
|---|---|---|---|
| 7,724,847 B2 | 5/2010 | Bublil et al. | |
| 8,779,819 B1 | 7/2014 | Venditti | |
| 9,071,243 B2 | 6/2015 | Gondi et al. | |
| 9,374,174 B1 | 6/2016 | Hammerschmidt | |
| 9,419,746 B1* | 8/2016 | Baeckler | H04L 1/0001 |
| 10,659,089 B2 | 5/2020 | Lafevre et al. | |
| 11,314,462 B2* | 4/2022 | Seong | G11C 7/1063 |
| 2006/0239107 A1 | 10/2006 | Boecker et al. | |
| 2011/0267098 A1 | 11/2011 | Song | |
| 2015/0160862 A1 | 6/2015 | Blott et al. | |
| 2017/0337965 A1 | 11/2017 | Ware et al. | |
| 2018/0359060 A1 | 12/2018 | Kim et al. | |
| 2019/0158085 A1* | 5/2019 | Rizvi | H03K 19/018592 |
| 2019/0305807 A1* | 10/2019 | LaFevre | H04B 1/0483 |
| 2019/0349226 A1* | 11/2019 | Chong | H04L 25/03343 |
| 2022/0020419 A1* | 1/2022 | Wu | G11C 7/1084 |
| 2022/0116049 A1* | 4/2022 | McPhalen | H03M 1/1245 |

* cited by examiner

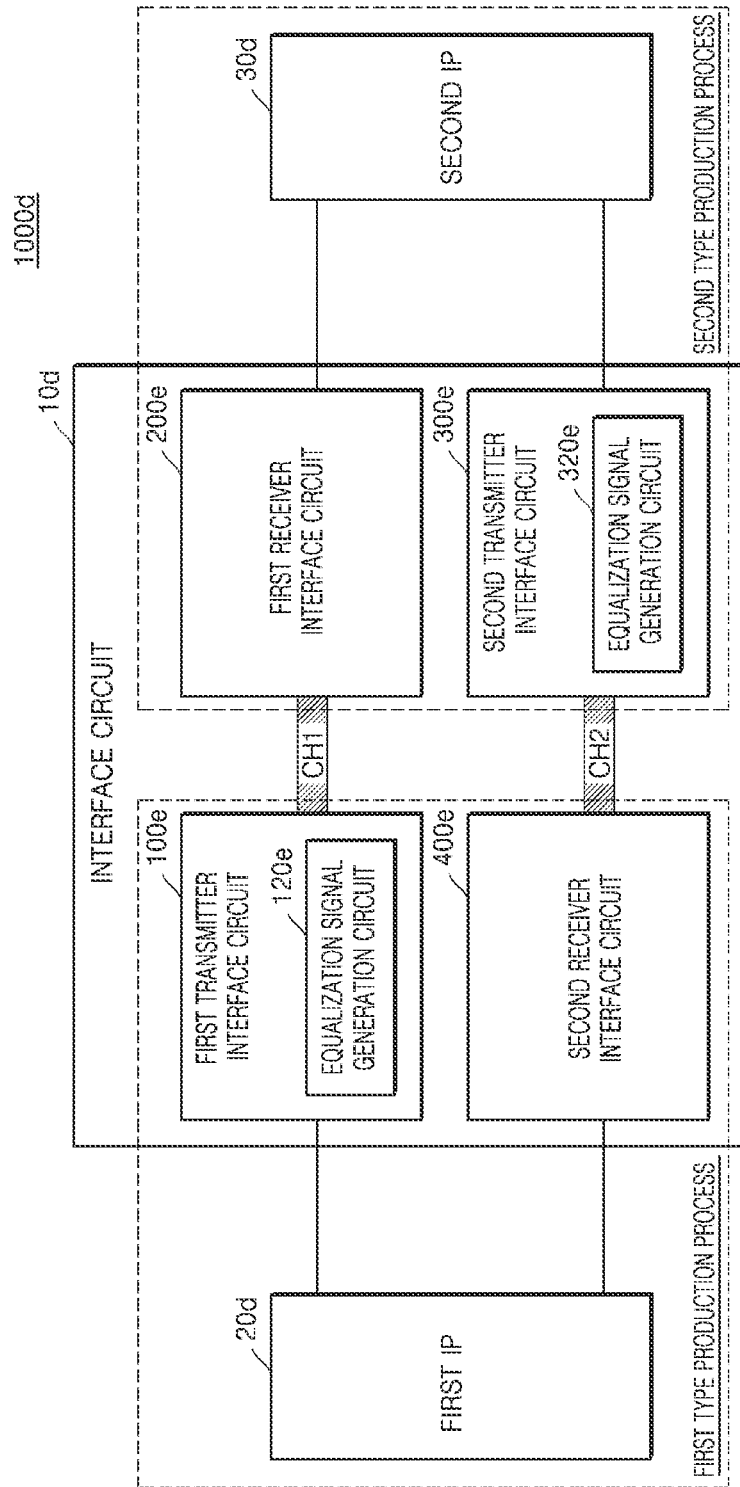

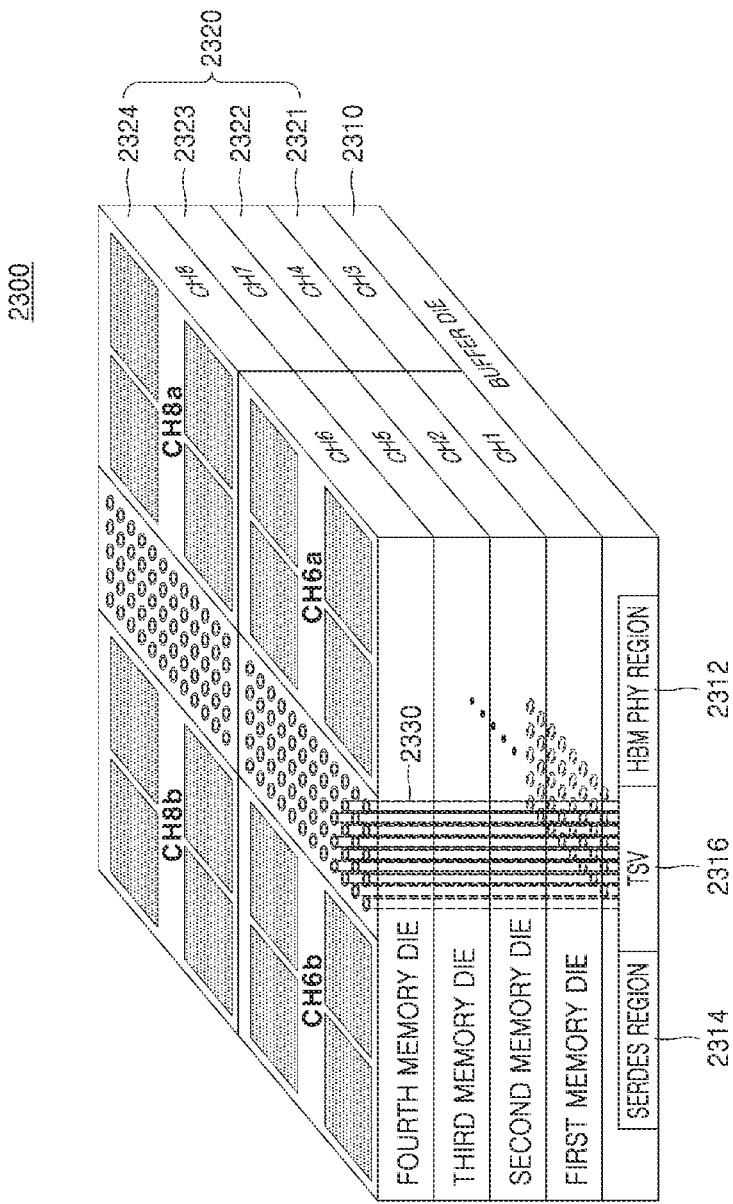

INTERFACE CIRCUIT AND SYSTEM INCLUDING SAME

CROSS-REFERENCE TO RELATED APPLICATION

This is a Continuation of U.S. application Ser. No. 17/198,383, filed Mar. 11, 2021, and a claim priority under 35 U.S.C. § 119 to Korean Patent Application No. 10-2020-0105537 filed on Aug. 21, 2020 in the Korean Intellectual Property Office, the subject matter of which is hereby incorporated by reference.

BACKGROUND

Embodiments of the inventive concept relate to interface circuits, and more particularly, to interface circuits capable improving signal communication between intellectual properties (IPs). Embodiments of the inventive concept relate to memory systems including such interface circuits.

With recent developments in data technology, a huge amount of data must be exchanged between heterogeneous IPs, and accordingly, a great demand for high-speed interface circuits has arisen. When high-speed interface circuits support die-to-die (D2D) communication, data signals may be transmitted via relatively short internal channel(s) due to the characteristics of the D2D communication. Thus, it may take only a short time for signals (e.g., data signals) to be communicated from a transmitter to a receiver via a high-speed interface circuit. Unfortunately, this approach and the corresponding system configurations are susceptible to the generation of a reflected wave which may impair signal quality at the receiver. Accordingly, a technique for reducing the influence of a reflected wave in a high-speed interface circuit performing D2D communication is desired.

SUMMARY

Embodiments of the inventive concept provide interface circuits configured to generate an equalization signal that suppresses a reflected wave generated during data signal transmission in order to increase data signal quality of a receiver. Embodiments of the inventive concept also provide systems including such interface circuits.

According to an aspect of the inventive concept, there is provided an interface circuit including a transmitter interface circuit including an output pad and configured to receive a first input data signal and generate a second input data signal from the first input data signal, and a receiver interface circuit including an input pad and configured to receive the second input data signal via the output pad and an internal channel, wherein the transmitter interface circuit further includes an equalization signal generation circuit configured to receive the first input data signal, generate a pulse signal by delaying the first input data signal by applying a target delay time or a target width adjustment to the first input data signal, generate an equalization signal based on the pulse signal, and provide the equalization signal to the output pad to suppress a reflected wave on the internal channel.

According to an aspect of the inventive concept, there is provided an interface circuit including; a first transmitter interface circuit including a first output pad and a first equalization signal generation circuit and configured to receive a first input data signal and generate a second input data signal from the first input data signal, a first receiver interface circuit including a first input pad and configured to receive the second input data signal transmitted via the first output pad and a first internal channel, a second transmitter interface circuit including a second output pad and a second equalization signal generation circuit and configured to receive a third input data signal and generate a fourth input data signal from the third input data signal, and a second receiver interface circuit including a second input pad and configured to receive the fourth input data signal transmitted via the second output pad and a second internal channel. The first equalization signal generation circuit is configured to receive the first input data signal, generate a first pulse signal by delaying the first input data signal by applying a first target delay time or a first target width adjustment to the first input data signal, generate a first equalization signal based on the first pulse signal, and provide the first equalization signal to the first output pad to suppress a first reflected wave on the first internal channel, and the second equalization signal generation circuit is configured to receive the third input data signal, generate a second pulse signal by delaying the third input data signal by applying a second target delay time or a second target width adjustment to the third input data signal, generate a second equalization signal based on the second pulse signal, and provide the second equalization signal to the second output pad to suppress a second reflected wave on the second internal channel.

According to an aspect of the inventive concept, there is provided a system including; a first intellectual property (IP) block, a second IP block and an interface circuit connecting the first IP block and the second IP block using an internal channel. The interface circuit includes; a transmitter interface circuit configured to receive a first input data signal from the first IP block, serialize the first input data signal to generate a serialized first data input signal, generate a pulse signal by adjusting at least one of a delay time of the serialized first input data signal and a width of a pulse of the serialized first input data signal, generate an equalization signal based on the pulse signal, and output a second input data signal by combining the serialized first input data signal with the equalization signal, and a receiver interface circuit configured to receive the second input data signal, parallelize the second input data signal to generate a parallelized second input data signal, and provide the parallelized second input data signal to the second IP block. The parallelized second input data signal is communicated from the transmitter interface circuit to the receiver interface circuit via the internal channel.

According to an aspect of the inventive concept, there is provided an interface circuit connecting a first intellectual property (IP) block and a second IP block using an internal channel, and configured to facilitate die-to-die (D2D) communication between the first IP block and the second IP block. The interface circuit includes; a transmitter interface circuit produced using a same type of production process as the first IP block and configured to receive a first input data signal from the first IP block, generate an equalization signal from the first input data signal, and output a second input data signal by combining the first input data signal with the equalization signal, and a receiver interface circuit produced using a same type of production process as the second IP block and configured to receive and output the second input data signal to the second IP block. The internal channel is used to communicate the second input data signal from the transmitter interface circuit to the receiver interface circuit.

BRIEF DESCRIPTION OF THE DRAWINGS

Embodiments of the inventive concept may be more clearly understood upon consideration of the following detailed description together with the accompanying drawings in which:

FIGS. 9, 10, 11, 12A and 12B are respective block diagrams variously illustrating systems according to embodiments of the inventive concept.

DETAILED DESCRIPTION

Hereinafter, embodiments will be described in detail with reference to the accompanying drawings. Throughout the written description and drawings, like reference numbers and labels are used to denote like or similar elements and/or features.

Figure 1A:
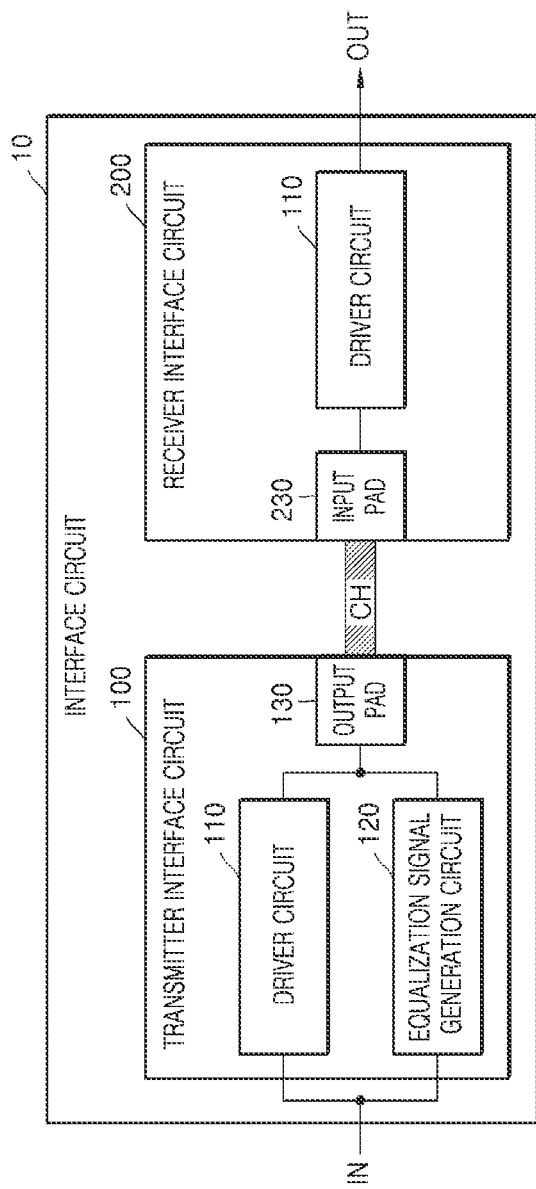
FIGS. 1A and 1B are block diagrams of interface circuits according to embodiments of the inventive concept.
Figure 1B:
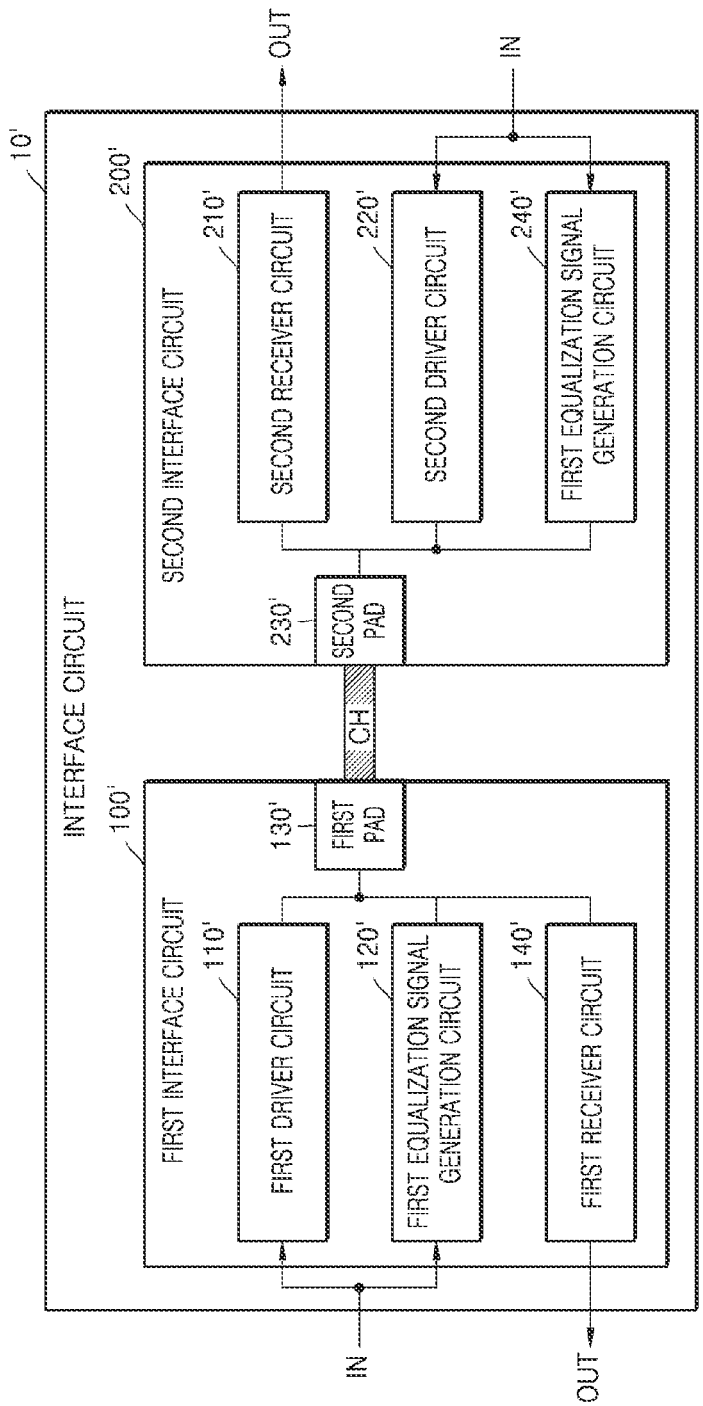

FIGS. 1A and 1B are block diagrams respectively illustrating interface circuits 10 and 10' according to embodiments of the inventive concept.

Referring to FIG. 1A, the interface circuit 10 may generally include a transmitter interface circuit 100, a receiver interface circuit 200 and an internal channel CH. The interface circuit 10 may be used to communicate (e.g., transmit and/or receive) a data signal between heterogeneous intellectual properties (IPs). In some embodiments, the interface circuit 10 may be configured to support die-to-die (D2D) communication between IPs.

In the illustrated example of FIG. 1A, the transmitter interface circuit 100 may include a driver circuit 110, an equalization signal generation circuit 120 and an output pad 130, where the driver circuit 110 may be connected in parallel with the equalization signal generation circuit 120. Accordingly, the driver circuit 110 and the equalization signal generation circuit 120 may receive a first input data signal IN from a first IP (not shown). An output terminal of the driver circuit 110 and an output terminal of the equalization signal generation circuit 120 may be connected to the output pad 130. With this configuration, signals respectively output by the driver circuit 110 and by the equalization signal generation circuit 120 may be combined at the output pad 130. Thus, the driver circuit 110 may receive and drive (or amplify) the first input data signal IN, and then provide the resulting driven (or an amplified) signal to the output pad 130.

The equalization signal generation circuit 120 may generate a pulse signal by delaying the first input data signal IN by a target delay time and/or by adjusting the width of the first input data signal IN to a target width. In this regard, the equalization signal generation circuit 120 may generate an equalization signal that effectively suppresses a reflected wave that may be apparent on the internal channel CH, based on the pulse signal and provide the equalization signal to the output pad 130. In this context, the term "wave" denotes any signal and/or noise component, regardless of shape, communicated via the internal channel CH.

The output pad 130 may output to the internal channel CH a second input data signal that results from a combination of signals respectively output from the driver circuit 110 and the equalization signal generation circuit 120.

The reflected wave noted above is an undesired (or noise) signal generated at the receiver interface circuit 200 in response to the first input data signal IN. That is, when a signal (e.g., the amplified version of the first input data signal IN) is transmitted from the transmitter interface circuit 100 to the receiver interface circuit 200 via the internal channel CH, some portion of the signal may be reflected back towards the transmitter interface circuit along the internal channel CH. This reflected wave may interfere with (or degrade the quality of) signals being communicated by the internal channel CH. Accordingly, the equalization signal may be provided to reduce the influence of the reflected wave.

However, in relation to the illustrated example of FIG. 1A, those skilled in the art will recognize that embodiments of the inventive concept may be variously used to generate an equalization signal that suppresses reflected wave(s) generated by a variety of causes. As described above, the equalization signal generation circuit 120 may be used to generate an equalization signal using the first input data signal IN, and may thus generate the equalization signal corresponding to a shape of a reflected wave, wherein the shape of the reflected wave varies with a transition type (e.g., a transition from a low level (hereafter, "low") to a high level (hereafter, "high"), and/or a transition from high to low) of the first input data signal IN.

In some embodiments, a target delay time or a target width, each of which may be used to generate a pulse signal from the first input data signal IN, may be preset by a training operation. In this regard, the training operation may be periodically or non-periodically performed. For example, the training operation may be performed upon power-on of the interface circuit 10.

Here, at least one of a delay time value and a width adjustment value associated with the operation of the equalization signal generation circuit 120 may be changed, and a training data signal may be transmitted to the receiver interface circuit 200 from the transmitter interface circuit 100 via the internal channel CH. At least one delay time value (possibly selected from among a range of delay time values) and/or at least one width adjustment value (possibly selected from among a range of width adjustment values) may be set based on the reception quality of the training data signal, as received at the receiver interface circuit 200. This approach will be described in some additional in detail with reference to FIGS. 7A and 7B hereafter.

The internal channel CH may be relatively short for D2D communication. In some embodiments, the internal channel CH may be configured such that a unit interval of the first input data signal IN (or the second input data signal) is less than the twice the flight time of the second input data signal from the output pad 130 to an input pad 230. Here, the unit interval may be defined as a minimum time interval between state changes of the first input data signal IN (or the second input data signal) and may be referred to as a pulse time or a symbol period time, for example.

In the illustrated example of FIG. 1A, the receiver interface circuit 200 generally includes a receiver circuit 210 and the input pad 230. The input pad 230 may receive the second input data signal via the internal channel CH, and provide the received second input data signal to the receiver circuit 210. The receiver circuit 210 may drive (or amplify) the second input data signal and provide the result as an output data signal OUT to a second IP (not shown).

With the foregoing in mind, the interface circuit 10 may be used to suppress a reflected wave apparent on the internal channel CH due to the relatively short transmission distance resulting from (and required to support) D2D communication. This suppression may be accomplished by generating an equalization signal using the transmitter interface circuit 100, thereby improving the reception quality of the receiver interface circuit 200.

Referring to FIG. 1B, the interface circuit 10' may generally include a first interface circuit 100' and a second interface circuit 200', wherein the first interface circuit 100' is connected to the second interface circuit 200' via the internal channel CH.

Here, the first interface circuit 100' may include a first driver circuit 110', a first equalization signal generation circuit 120', a first pad 130' and a first receiver circuit 140'. The second interface circuit 200' may include a second receiver circuit 210', a second driver circuit 220', a second pad 230' and a second equalization signal generation circuit 240'. The components described above with reference to FIG. 1A may be applied to the first interface circuit 100' and the second interface circuit 200' of FIG. 1B.

Outputs of the first driver circuit 110', the first equalization signal generation circuit 120', and the first receiver circuit 140' are commonly connected to the first pad 130'. Outputs of the second receiver circuit 210', the second driver circuit 220', and the second equalization signal generation circuit 240' are commonly connected to the second pad 230'.

In some embodiments, each of the first pad 130' and the second pad 230' may be an input/output (I/O) pad used to receive and/or output signal(s) in relation to the internal channel CH. For example, the first pad 130' may output the first input data signal IN, received by the first interface circuit 100' via the internal channel CH, or may receive the first input data signal IN, received by the second interface circuit 200' via the internal channel CH. The second pad 230' may output the first input data signal IN, received by the second interface circuit 200' via the internal channel CH, or may receive the first input data signal IN, received by the first interface circuit 100' via the internal channel CH. Thus, each of the first pad 130' and the second pad 230' may be implemented by a bidirectional pad in relation to the embodiments illustrated in FIG. 1B.

Figure 2:
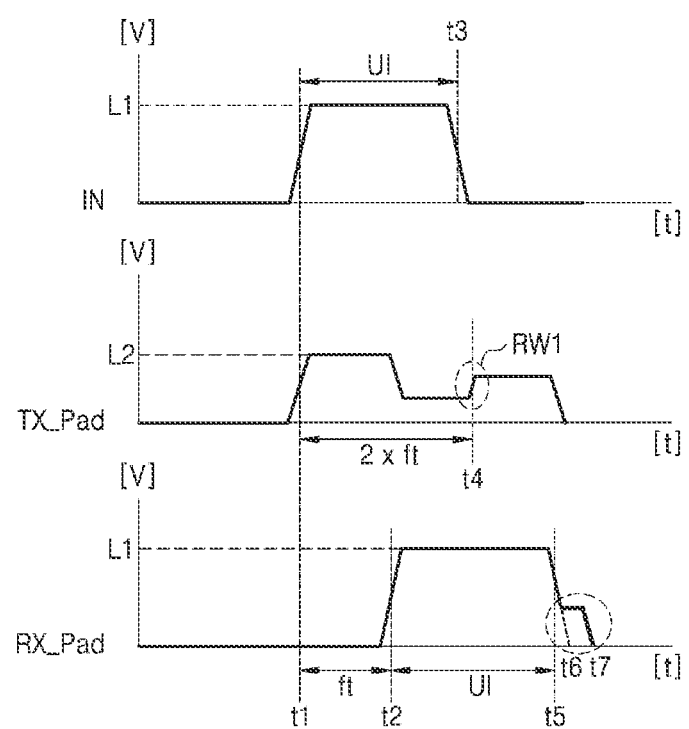
FIG. 2 is a timing diagram further describing the influence of a reflected wave generated by an interface circuit supporting die-to-die (D2D) communication.
Figure 3:
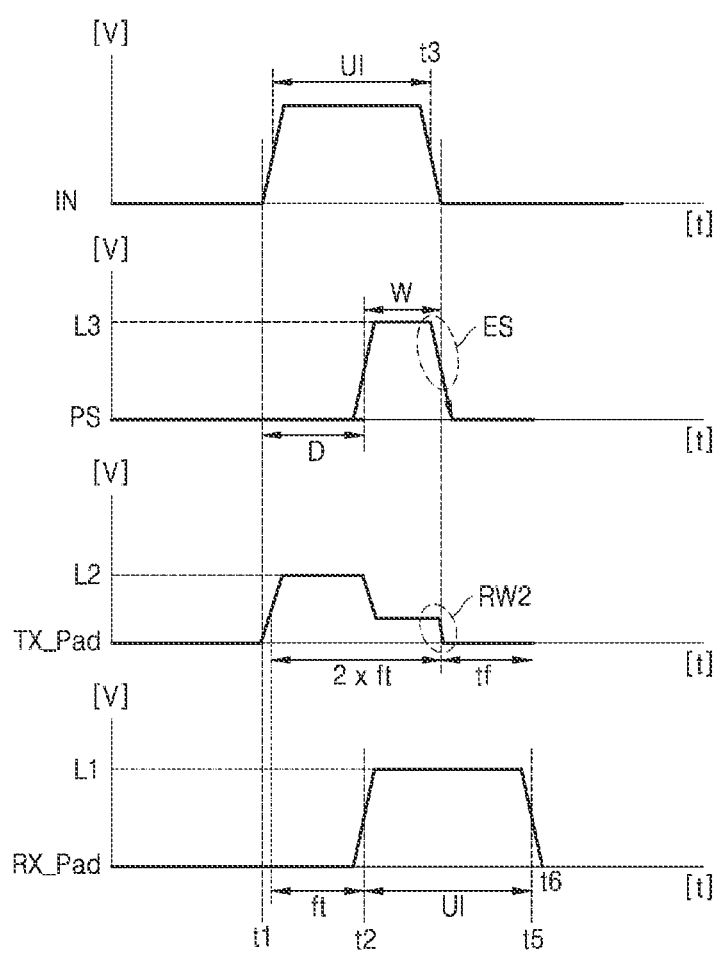
FIG. 3 is a timing diagram further describing the suppression of a reflected wave by an interface circuit according to embodiments of the inventive concept.

FIG. 2 is a timing diagram illustrating the influence of a reflected wave generated by an interface circuit supporting D2D communication, and FIG. 3 is a timing diagram illustrating operation of an interface circuit suppressing the reflected wave according to an embodiments of the inventive concept. Hereinafter, a unit interval UI is assumed to be less than twice the flight time 'ft' of a signal 'f' from an output pad TX_Pad of a transmitter interface circuit of an interface circuit to an input pad RX_Pad of a receiver interface circuit of the interface circuit. However, this is just an illustrative example and the inventive concept is not limited thereto. Embodiments may also be applied when certain conditions between the unit interval UI and the signal flight time ft are satisfied.

Referring to FIG. 2, the interface circuit is assumed to receive a first input data signal IN that transitions from low to high (e.g., a first level L1) at time t1 and has a unit interval UI corresponding to a period between time t1 and time t3. Hence, a first signal output from the output pad TX_Pad of the transmitter interface circuit of the interface circuit may transition from low to a second level L2 at time t1 in response to the first input data signal IN. Here, the second level L2 is lower than the first level L1 due to a ratio of an equivalent resistance of the transmitter interface circuit to a resistance of an internal channel. After a lapse of twice the signal flight time ft, the first signal at the output pad TX_Pad may have a rising edge at time t4 due to a reflected wave RW1 generated by the receiver interface circuit.

After a lapse of the signal flight time ft from time t1, a second signal input at the input pad RX_Pad of the receiver interface circuit of the interface circuit is assumed to transition from low to high (e.g., first level L1) at time t2 in response to the first signal. The second signal at the input pad RX_Pad may transition from high to low at time t5 after the unit interval UI elapses from the time t2. The second signal of the input pad RX_Pad may have a slow transition slope at time t6 due to the influence of the reflected wave RW1, and accordingly, the completion of the transition to low may be delayed from time t6 to time t7. Such lagging of the second signal at the input pad RX_Pad may degrade the reception quality.

However, such problems may be effective addressed by embodiments of the inventive concept.

Referring to FIG. 3, the interface circuit according to an embodiment of the inventive concept is assumed to generate an equalization signal ES that suppresses the reflected wave RW1 of FIG. 2. That is, a transmitter interface circuit of the interface circuit may generate a pulse signal PS by delaying the first input data signal IN by a target delay time 'D' or by adjusting the width of the first input data signal IN to a target width W. The pulse signal PS may transition from low to high (e.g., a third level L3) at a time t2+D, where the third level L3 may be the same as the second level L2 of FIG. 2. The transmitter interface circuit may generate the equalization signal ES, which includes a falling edge at time t4, from the pulse signal PS and provide the equalization signal ES to an output pad. A rising edge of a reflected wave RW2 in the first signal of the output pad TX_Pad at time t4 may be suppressed by the equalization signal ES. As a result, the second signal of the input pad RX_Pad completes the transition from high to low at time t6, and accordingly, the reception quality of a receiver interface circuit may be improved. In some embodiments, the target delay time D and the target width W may be determined to generate the equalization signal ES agreeing with the timing of the rising edge of the reflected wave RW1 of FIG. 2. As described above, the target delay time D and the target width W may be periodically or non-periodically determined using a training operation.

Although FIG. 3 shows the equalization signal ES including the falling edge of the pulse signal PS, other embodiments of the inventive concept are not limited thereto. The equalization signal ES including a rising edge of the pulse signal PS may be generated to suppress a reflected wave caused by another pattern of the first input data signal IN.

Figure 4A:
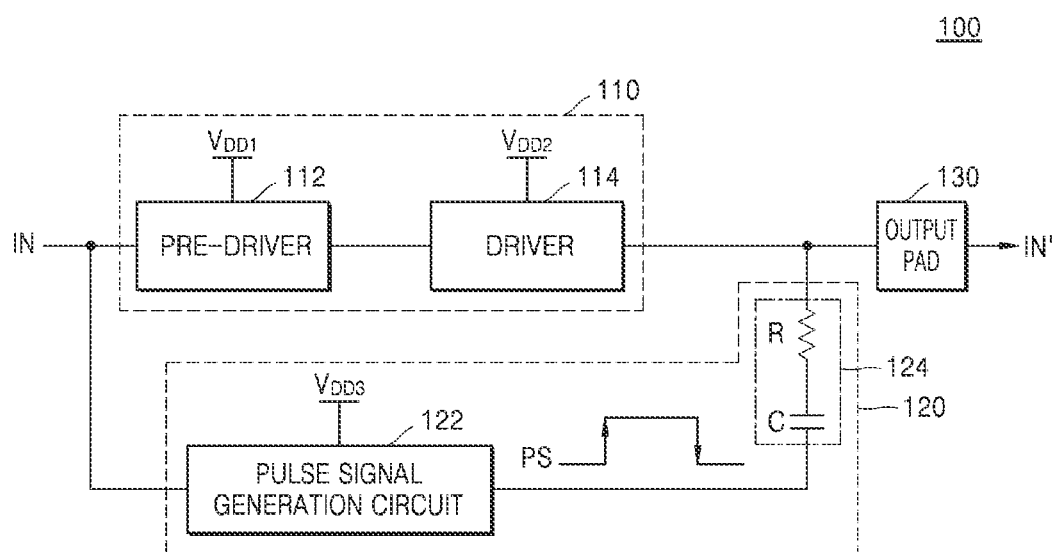
FIGS. 4A and 4B are block diagrams further illustrating the transmitter interface circuit of FIG. 1A.
Figure 4B:
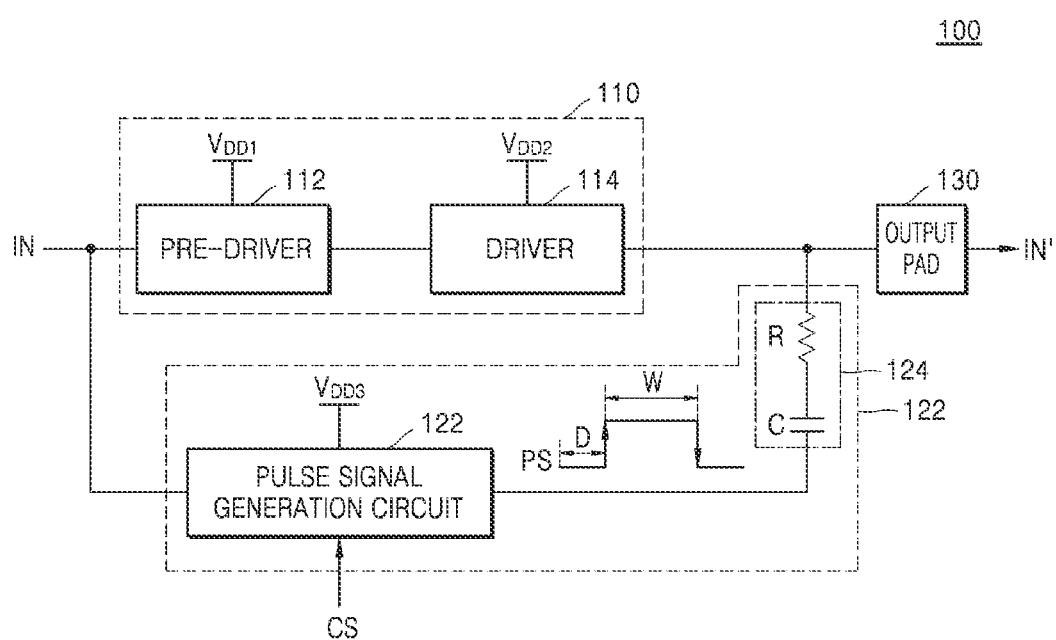

FIGS. 4A and 4B are respective block diagrams further illustrating examples of the transmitter interface circuit 100 of FIG. 1A.

Referring to FIG. 4A, the transmitter interface circuit 100 may include the driver circuit 110, the equalization signal generation circuit 120 and the output pad 130. The driver circuit 110 may include a pre-driver 112 and a driver 114. The pre-driver 112 may pre-drive the first input data signal IN using a first power supply voltage $V_{DD1}$ and then provide the first input data signal IN to the driver 114. The driver 114 may drive the first input data signal IN received from the pre-driver 112 using a second power supply voltage $V_{DD2}$ and then output the first input data signal IN to the output pad 130. In some embodiments, the level of the first power supply voltage $V_{DD1}$ may be higher than the level of the second power supply voltage $V_{DD2}$. That is, the first input data signal IN may be driven using the first power supply voltage $V_{DD1}$ which is relatively high, and then additionally driven using the second power supply voltage $V_{DD2}$ which is relatively low, so that the overall power consumed by signal driving may be reduced.

The equalization signal generation circuit 120 may include a pulse signal generation circuit 122 and a filtering circuit 124. The pulse signal generation circuit 122 may receive the first input data signal IN and generate the pulse signal PS using a third power supply voltage $V_{DD3}$. The third power supply voltage $V_{DD3}$ may have a higher level than the second power supply voltage $V_{DD2}$ and may be equal to the first power supply voltage $V_{DD1}$. However, this is just one possible example, and each of the first through third power supply voltages $V_{DD1}$ through $V_{DD3}$ may have various levels. For example, the pulse signal generation circuit 122 may generate the pulse signal PS by delaying the first input data signal IN by a target delay time or adjusting the width of the first input data signal IN to a target width.

The filtering circuit 124 may include a capacitor element C and a resistor element R. For example, the filtering circuit 124 may filter a direct current (DC) component of the pulse signal PS and generate an equalization signal including an alternating current (AC) component of the pulse signal PS. In some embodiments, the equalization signal may include a falling edge component or a rising edge component of the pulse signal PS to suppress a reflected wave reaching the output pad 130. The configuration of the filtering circuit 124 is just an example, and embodiments are not limited thereto. The filtering circuit 124 may have various configurations. The output pad 130 may output a second input data signal IN' resulting from a combination of the first input data signal IN, which has been driven, with the equalization signal.

Referring to FIG. 4B, the pulse signal generation circuit 122 may receive a control signal CS and set or change, based on the control signal CS, at least one of the target delay time D and the target width W with respect to the pulse signal PS. That is, at least one of the target delay time D and the target width W may be determined through a training operation, and the control signal CS may be provided to the pulse signal generation circuit 122, such that the pulse signal PS agreeing with (or compatible with) at least one the selected one of the target delay time D and the target width W may be generated.

Figure 5A:
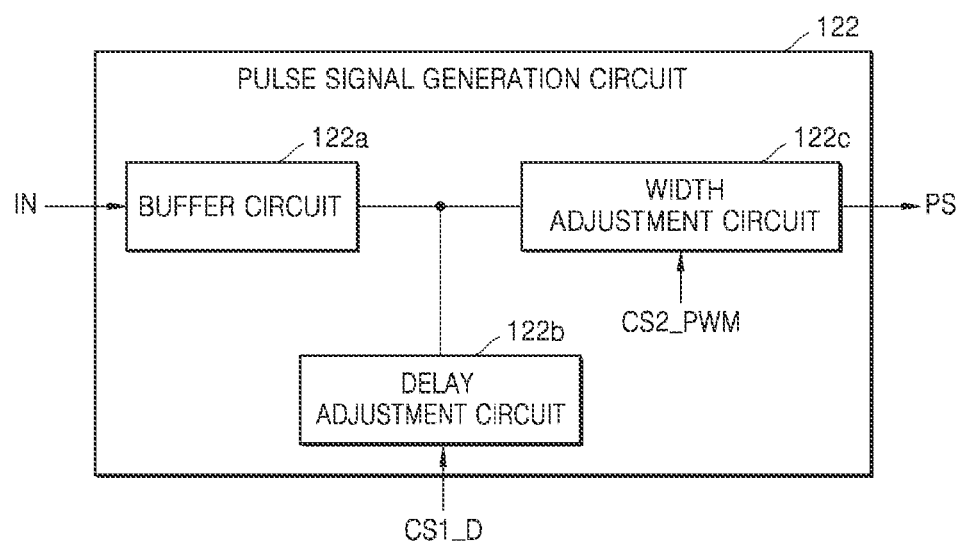
FIGS. 5A and 5B are block diagrams further illustrating the pulse signal generation circuit of FIG. 4A.
Figure 5B:
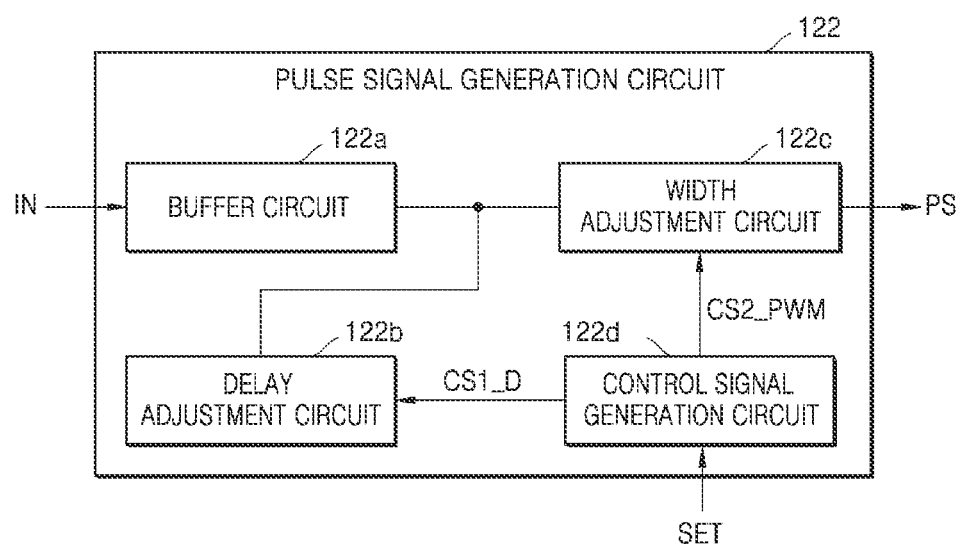

FIGS. 5A and 5B are respective block diagrams illustrating in examples the pulse signal generation circuit 122 of FIG. 4A.

Referring to FIG. 5A, the pulse signal generation circuit 122 may include a buffer circuit 122*a*, a delay adjustment circuit 122*b*, and a width adjustment circuit 122*c*. The buffer circuit 122*a* may receive and buffer the first input data signal IN. The delay adjustment circuit 122*b* may externally receive a first control signal CS1_D and delay the first input data signal IN by a target delay time based on the first control signal CS1_D. The width adjustment circuit 122*c* may externally receive a second control signal CS2_PWM and adjust the width of the first input data signal IN to a target width based on the second control signal CS2_PWM. The width adjustment circuit 122*c* may output the pulse signal PS generated by delaying the first input data signal IN by the target delay time or adjusting the width of the first input data signal IN to the target width.

Referring to FIG. 5B, the pulse signal generation circuit 122 may further include a control signal generation circuit 122*d*, as compared with the pulse signal generation circuit 122 of FIG. 5A. The control signal generation circuit 122*d* may be used to generate the first control signal CS1_D and the second control signal CS2_PWM based on a received set signal SET.

Figure 6A:
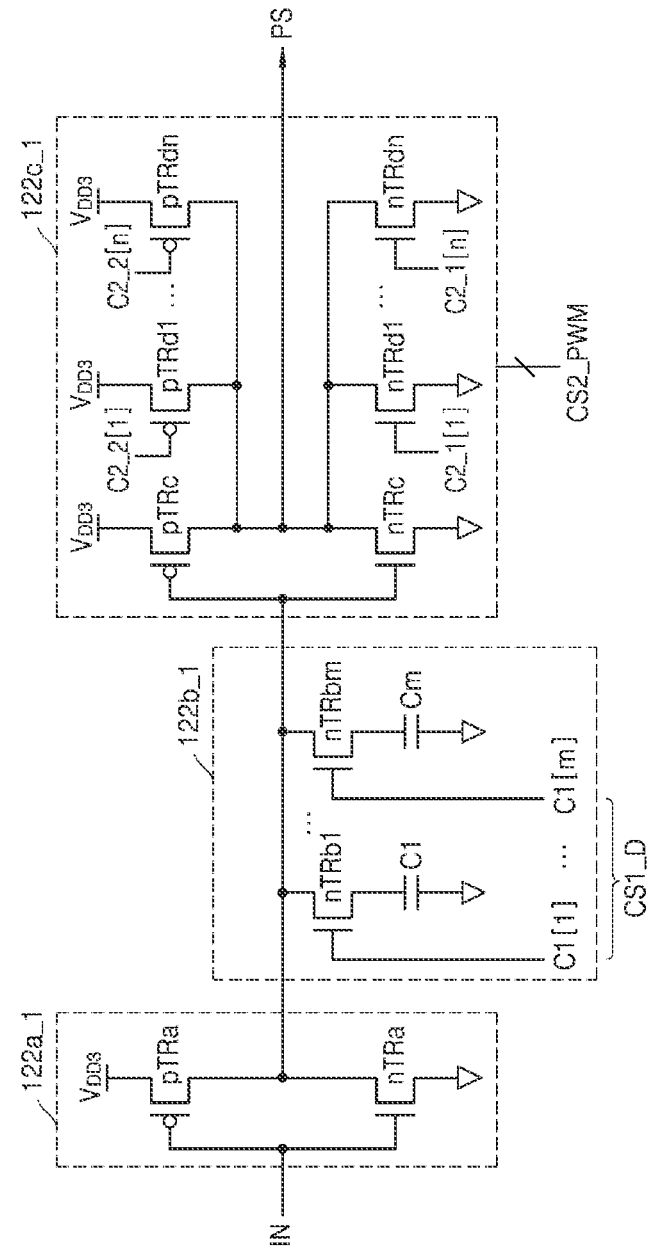
FIGS. 6A and 6B are circuit diagrams further illustrating the pulse signal generation circuit of FIG. 5A.
Figure 6B:
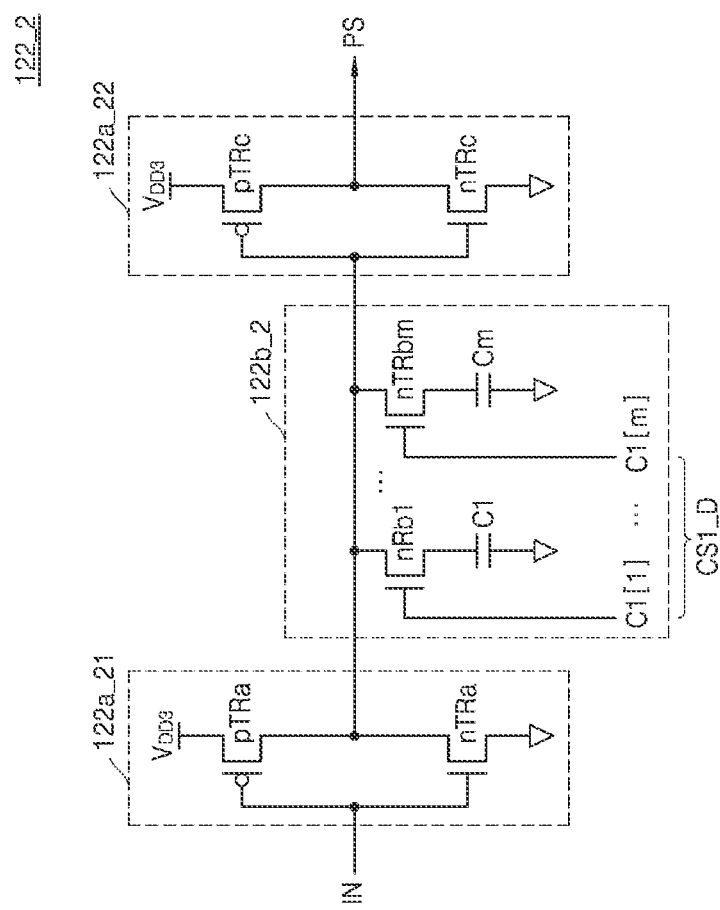

FIGS. 6A and 6B are respective circuit diagrams illustrating examples (122_1 and 122_2) of the pulse signal generation circuit 122 of FIG. 5A.

Referring to FIG. 6A, a pulse signal generation circuit 122_1 may include a buffer circuit 122*a*_1, a delay adjustment circuit 122*b*_1, and a width adjustment circuit 122*c*_1. In an example embodiment, the buffer circuit 122*a*_1 may include a negative-channel metal-oxide semiconductor (nMOS) transistor nTRa and a positive-channel MOS (pMOS) transistor pTRa. A gate terminal of each of the nMOS transistor nTRa and the pMOS transistor pTRa may receive the first input data signal IN. A source terminal of the nMOS transistor nTRa may be grounded, and a source terminal of the pMOS transistor pTRa may receive the third power supply voltage $V_{DD3}$. A drain terminal of the nMOS transistor nTRa may be connected to a drain terminal of the pMOS transistor pTRa. The buffer circuit 122*a*_1 may receive and buffer (or amplify) the first input data signal IN.

In some embodiments, the delay adjustment circuit 122*b*_1 may include first through m-th nMOS transistors nTRb1 through nTRbm and first through m-th capacitors C1 through Cm. The first through m-th nMOS transistors nTRb1 through nTRbm may be connected in parallel to each other and may be respectively connected in series to the first through m-th capacitors C1 through Cm. The delay adjustment circuit 122*b*_1 may receive the first control signal CS1_D and delay the first input data signal IN by the target delay time based on the first control signal CS1_D. The first control signal CS1_D may include first through m-bit signals C1[1] through C1[m]. Respective gate terminals of the first through m-th nMOS transistors nTRb1 through nTRbm may respectively receive the first through m-bit signals C1[1] through C1[m], and the first through m-th nMOS transistors nTRb1 through nTR1m may be respectively turned ON/OFF in response to the first through m-bit signals C1[1] through C1[m]. For example, the number of nMOS transistors that are turned ON may vary with the target delay time.

In an example embodiment, the width adjustment circuit 122*c*_1 may include an nMOS transistor nTRc, a pMOS transistor pTRc, first through n-th nMOS transistors nTRd1 through nTRdn, and first through n-th pMOS transistors pTRd1 through pTRdn. A gate terminal of each of the nMOS transistor nTRc and the pMOS transistor pTRc may receive the first input data signal IN that has been delayed by the target delay time. A source terminal of each of the nMOS transistor nTRc and the first through n-th nMOS transistors nTRd1 through nTRdn may be grounded, and a source terminal of each of the pMOS transistor pTRc and the first through n-th pMOS transistors pTRd1 through pTRdn may receive the third power supply voltage $V_{DD3}$. A drain terminal of the nMOS transistor nTRc may be connected to a drain terminal of the pMOS transistor pTRc. The first through n-th nMOS transistors nTRd1 through nTRdn may be connected in parallel to the nMOS transistor nTRc, and the first through n-th pMOS transistors pTRd1 through pTRdn may be connected in parallel to the pMOS transistor pTRc. The width adjustment circuit 122*c*_1 may receive the second control signal CS2_PWM and adjust the width of the first input data signal IN to the target width based on the second control signal CS2_PWM. The second control signal CS2_PWM may include first through 2n-th bit signals C2_1[1] through C2_1[n] and C2_2[1] through C2_2[n]. Respective gate terminals of the first through n-th nMOS transistors nTRd1 through nTRdn may respectively receive the first through n-th bit signals C2_1[1] through C2_1[n], and the first through n-th nMOS transistors nTRd1 through nTRdn may be respectively turned ON/OFF in response to the first through n-th bit signals C2_1[1] through C2_1[n]. Respective gate terminals of the first through n-th pMOS transistors pTRd1 through pTRdn may respectively receive the (n+1)-th through 2n-th bit signals C2_2[1] through C2_2[n], and the first through n-th pMOS transistors pTRd1 through pTRdn may be respectively turned ON/OFF in response to the (n+1)-th through 2n-th bit signals C2_2[1] through C2_2[n]. For example, the number of nMOS transistors that are turned ON and the number of pMOS transistors that are turned ON may vary with the target width. The width adjustment circuit 122c_1 may output the pulse signal PS, which results from delaying the first input data signal IN by the target delay time and adjusting the width of the first input data signal IN to the target width.

However, the pulse signal generation circuit 122_1 is just an example, and other embodiments of the inventive concept are not limited thereto. Internal circuits (e.g., the buffer circuit 122a_1, the delay adjustment circuit 122b_1, and the width adjustment circuit 122c_1), may be implemented according to various circuit configurations to which embodiments of the inventive concept may be applied.

Referring to FIG. 6B, a pulse signal generation circuit 122_2 may include a first buffer circuit 122a_21, a second buffer circuit 122a_22, and a delay adjustment circuit 122b_2. The second buffer circuit 122a_22 may include an nMOS transistor nTRc and a pMOS transistor pTRc. Redundant descriptions given above with reference to FIG. 6A are omitted below. Compared with FIG. 6A, the pulse signal generation circuit 122_2 may generate the pulse signal PS by delaying the first input data signal IN by a target delay time. That is, the pulse signal generation circuit 122_2 may generate the pulse signal PS by delaying the first input data signal IN by the target delay time, without adjusting the width of the first input data signal IN. However, this is just one example and other embodiments of the inventive concept are not limited thereto. The pulse signal generation circuit 122_2 may generate the pulse signal PS by adjusting the width of the first input data signal IN to a target width, without delaying the first input data signal IN. Besides the foregoing, the pulse signal generation circuit 122_2 may generate the pulse signal PS in various ways to generate an equalization signal, which agrees with the rising edge timing of the reflected wave RW1 at time t4 in FIG. 2.

Figure 7A:
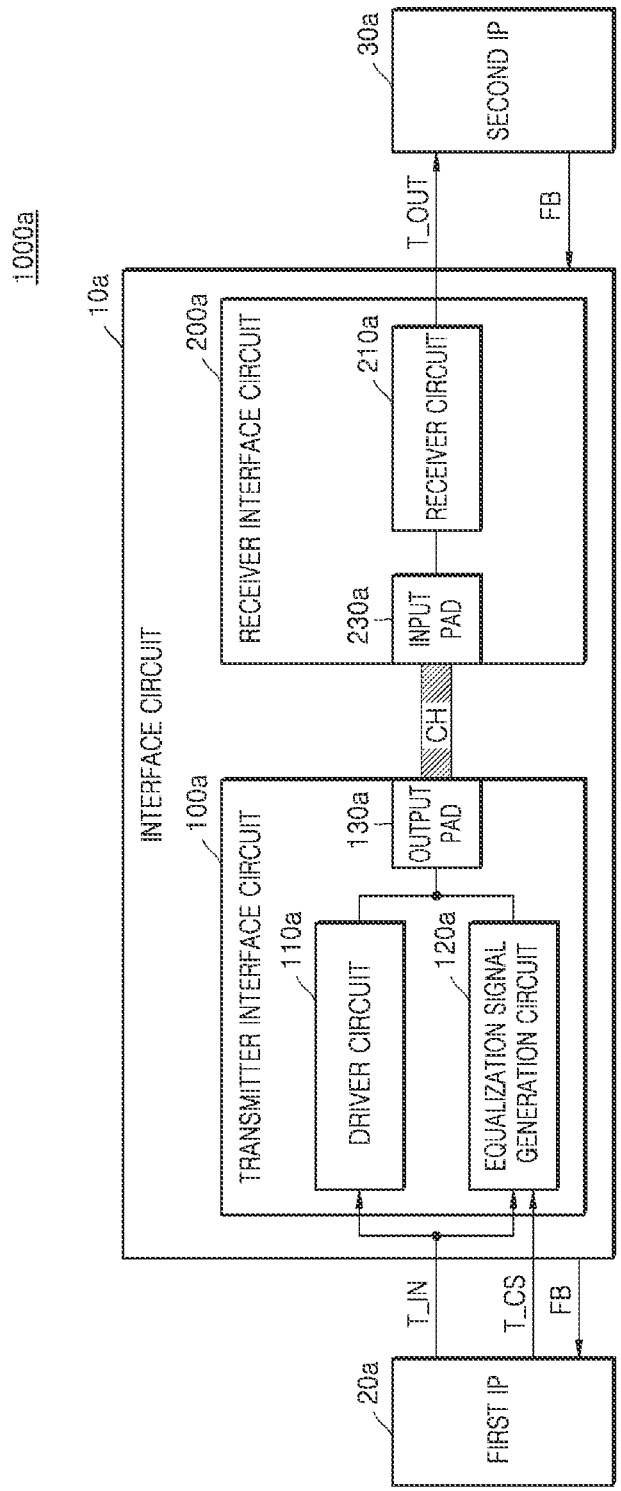
FIGS. 7A and 7B are block diagrams illustrating a training operation for generation of a pulse signal according to embodiments of the inventive concept.
Figure 7B:
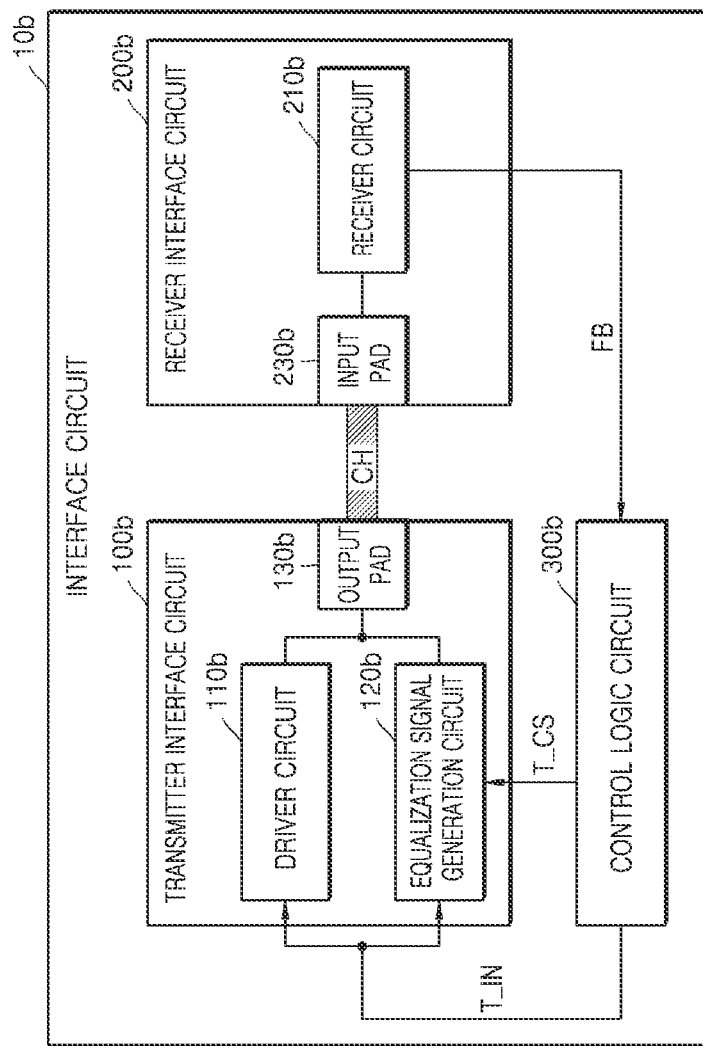

FIGS. 7A and 7B are respective, system block diagrams illustrating training operations that may be used to generate an appropriate pulse signal according to embodiments of the inventive concept.

Referring to FIG. 7A, a system 1000a may include a first IP 20a, a second IP 30a, and an interface circuit 10a. The interface circuit 10a may include a transmitter interface circuit 100a, a receiver interface circuit 200a, and the internal channel CH. The transmitter interface circuit 100a may include a driver circuit 110a, an equalization signal generation circuit 120a, and an output pad 130a. The receiver interface circuit 200a may include a receiver circuit 210a and an input pad 230a.

Each of the first IP 20a and the second IP 30a may include a function block, such as a central processing unit (CPU), a graphics processing unit (GPU), a neural processing unit (NPU), a communication processor (CP), each core of a multi-core processor, a power management unit (PMU), a clock management unit (CMU), a system bus, memory, a universal serial bus (USB), a peripheral component interconnect (PCI), a digital signal processor (DSP), a wired interface, a wireless interface, a controller, an embedded software component, a codec, a video module (e.g., a camera interface, a Joint Photographic Experts Group (JPEG) processor, a video processor, or a mixer), a three-dimensional (3D) graphics core, an audio system, a memory device, or a memory chip, which performs a certain function.

In some embodiments, a system according to embodiments of the inventive concept may be further characterized by a first operating frequency at which a first IP block operates and a second operating frequency, different from the first operating frequency, at which a second IP block operates.

The first IP 20a may be used to control the performing of a training operation, such that the equalization signal generation circuit 120a generates an optimal equalization signal capable of suppressing a reflected wave. In some embodiments, the first IP 20a may periodically or non-periodically cause the training operation to be performed as described below. For example, the first IP 20a may cause the training operation to be performed when the system 1000a is powered-on.

For example, the IP 20a may provide a training data signal T_IN and a training control signal T_CS to the transmitter interface circuit 100a. The training data signal T_IN may include a certain pattern for training. The training control signal T_CS may be used to define (or change) at least one of a delay time value and/or a width adjustment value associated with a pulse signal generated by the equalization signal generation circuit 120a. In some embodiments, the training data signal T_IN and the training control signal T_CS may include a number of signal bits.

The driver circuit 110a may drive and provide the training data signal T_IN to the output pad 130a. The equalization signal generation circuit 120a may generate a pulse signal by delaying the training data signal T_IN or adjusting the width of the training data signal T_IN based on the training control signal T_CS, generate an equalization signal from the pulse signal, and provide the equalization signal to the output pad 130a. The output pad 130a may transmit a signal, which results from a combination of the equalization signal with the training data signal T_IN, to the receiver interface circuit 200a via the internal channel CH.

The receiver interface circuit 200a may receive the signal, which is transmitted via the internal channel CH, through the input pad 230a. The receiver circuit 210a may drive and output the received signal to the second IP 30a. The second IP 30a may measure the quality of the received signal and may provide the interface circuit 10a with a feedback signal FB, which represents information about the signal quality. The interface circuit 10a may transmit the feedback signal FB to the first IP 20a. The first IP 20a may change the training control signal T_CS or the training data signal T_IN based on the feedback signal FB and then perform another training operation. In some embodiments, the receiver interface circuit 200a may generate and provide the feedback signal FB to the first IP 20a.

The first IP 20a may apply the training control signal T_CS (e.g., a final one) to the control signal CS in FIG. 4B when the signal quality that greater than or equal to a threshold value is secured as a result of the training operation. That is, the first IP 20a may generate and provide the control signal CS of FIG. 4B, for example, which agrees with the training control signal T_CS (e.g., the final one) to the transmitter interface circuit 100a. Alternately, as illustrated in FIG. 5B, the first IP 20a may generate and provide the set signal SET, such that the control signal generation circuit 122d may generate a control signal agreeing with the training control signal T_CS (e.g., the final one). However, the foregoing is just one approach that may be used and other embodiments of the inventive concept are not limited thereto, and the first IP 20a may variously control the performing of competent training operation.

Referring to FIG. 7B, an interface circuit 10b may include a transmitter interface circuit 100b, a receiver interface circuit 200b, an internal channel CH and control logic circuit 300b.

Here, the control logic circuit 300b may be used to control the performing of a training operation, such that an equalization signal generation circuit 120b may generate an optimal equalization signal capable of suppressing a reflected wave. The control logic circuit 300b may periodically or non-periodically control the performing of the training operation. For example, the control logic circuit 300b may cause the training operation to be performed upon power-on of the interface circuit 10b. The training data signal T_IN may include a certain pattern for training. The training control signal T_CS may be used to change a delay time amount and a width amount of a pulse signal generated by the equalization signal generation circuit 120b and may include a plurality of bit signals.

A driver circuit 110b may drive and provide the training data signal T_IN to an output pad 130b. The equalization signal generation circuit 120b may generate a pulse signal by delaying the training data signal T_IN or adjusting the width of the training data signal T_IN based on the training control signal T_CS, generate an equalization signal from the pulse signal, and provide the equalization signal to the output pad 130b. The output pad 130b may transmit a signal, which results from a combination of the equalization signal with the training data signal T_IN, to the receiver interface circuit 200b via the internal channel CH.

The receiver interface circuit 200b may receive the signal, which is transmitted via the internal channel CH, through an input pad 230b. A receiver circuit 210b may provide the control logic circuit 300b with the feedback signal FB, which represents the quality of the received signal. The control logic circuit 300b may change the training control signal T_CS or the training data signal T_IN based on the feedback signal FB and then perform another training operation. The control logic circuit 300b may apply the training control signal T_CS (e.g., the final one) to the control signal CS in FIG. 4B when the signal quality that is greater than or equal to a threshold value is secured as a result of training.

Figure 8:
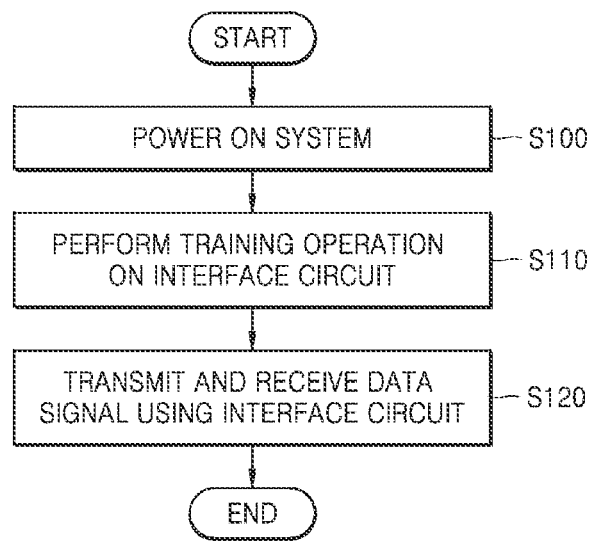
FIG. 8 is a flowchart summarizing an operating method for a system according to an embodiments of the inventive concept.

FIG. 8 is a flowchart summarizing in one example an operating method for a system according to embodiments of the inventive concept.

Referring to FIG. 8, upon power-on of a system including an interface circuit according to embodiments of the inventive concept (S100), a training operation may be performed in relation to the interface circuit (S110). More particularly, the training operation may be performed in relation to the generation of an equalization signal capable of suppressing a reflected wave in advance of a time at which a data signal will be transmitted from a transmitter interface circuit of the interface circuit to a receiver interface circuit of the interface circuit via an internal channel. Through the training operation, the interface circuit may generate an optimal equalization signal, which agrees with a data signal, when the data signal is transmitted from the transmitter interface circuit to the receiver interface circuit through the internal channel. Various IPs included in the system may then transmit and receive data signal(s) using the interface circuit (S120).

Figure 9:
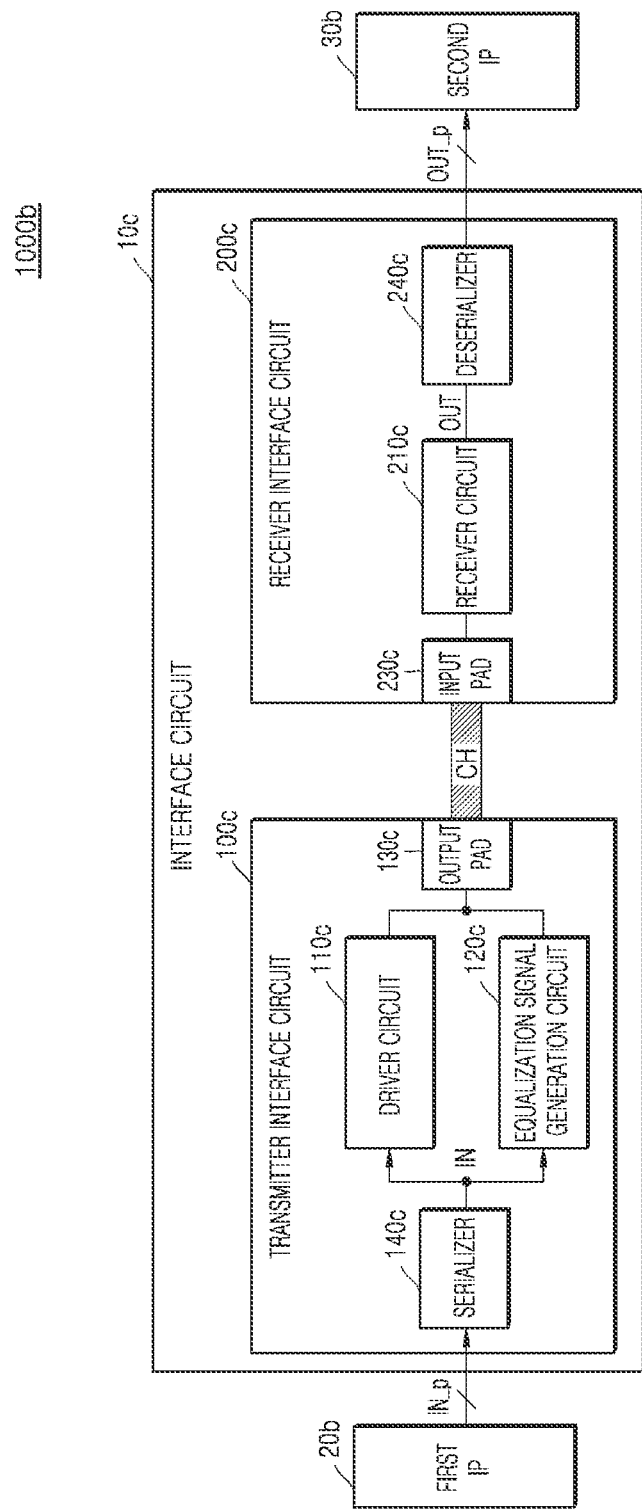

FIG. 9 is a block diagram illustrating a system 1000b according to embodiments of the inventive concept. The system 1000b may include an electronic system and may be mounted on a laptop computer, a smart phone, a tablet personal computer (PC), a personal digital assistant (PDA), an enterprise digital assistant (EDA), a digital camera, a portable multimedia player (PMP), a portable navigation device (PND), a handheld game console, a mobile internet device (MID), a multimedia device, a wearable computer, an internet of things (IoT) device, an e-book, a drone, an advanced drivers assistance system (ADAS), an augmented reality (AR) device, and an electronic device that performs high-speed communication.

Referring to FIG. 9, the system 1000b may include a first IP 20b, a second IP 30b and an interface circuit 10c. The interface circuit 10c may include a transmitter interface circuit 100c, a receiver interface circuit 200c, and an internal channel CH. The transmitter interface circuit 100c may include a driver circuit 110c, an equalization signal generation circuit 120c, an output pad 130c and a serializer 140c. The receiver interface circuit 200c may include a receiver circuit 210c, an input pad 230c, and a deserializer 240c.

The first IP 20b may transmit a first input data signal IN_p, which has been parallelized, to the interface circuit 10c. The serializer 140c may serialize the first input data signal IN_p and transmit the first input data signal IN, which has been serialized, to the driver circuit 110c and the equalization signal generation circuit 120c. The output pad 130c may generate a second input data signal by combining an output signal of the driver circuit 110c with an output signal of the equalization signal generation circuit 120c and transmit the second input data signal to the receiver interface circuit 200c through the internal channel CH. The input pad 230c may transmit the second input data signal to the receiver circuit 210c, and the receiver circuit 210c may transmit the second input data signal as a first output data signal OUT to the deserializer 240c. The deserializer 240c may parallelize the first output data signal OUT and transmit a parallelized result (i.e., a second output data signal OUT_p) to the second IP 30b.

In some embodiments, a parallel interface mode may be applied between the first IP 20b and the transmitter interface circuit 100c and between the second IP 30b and the receiver interface circuit 200c. A serial interface mode may be applied between the transmitter interface circuit 100c and the receiver interface circuit 200c.

Figure 10:
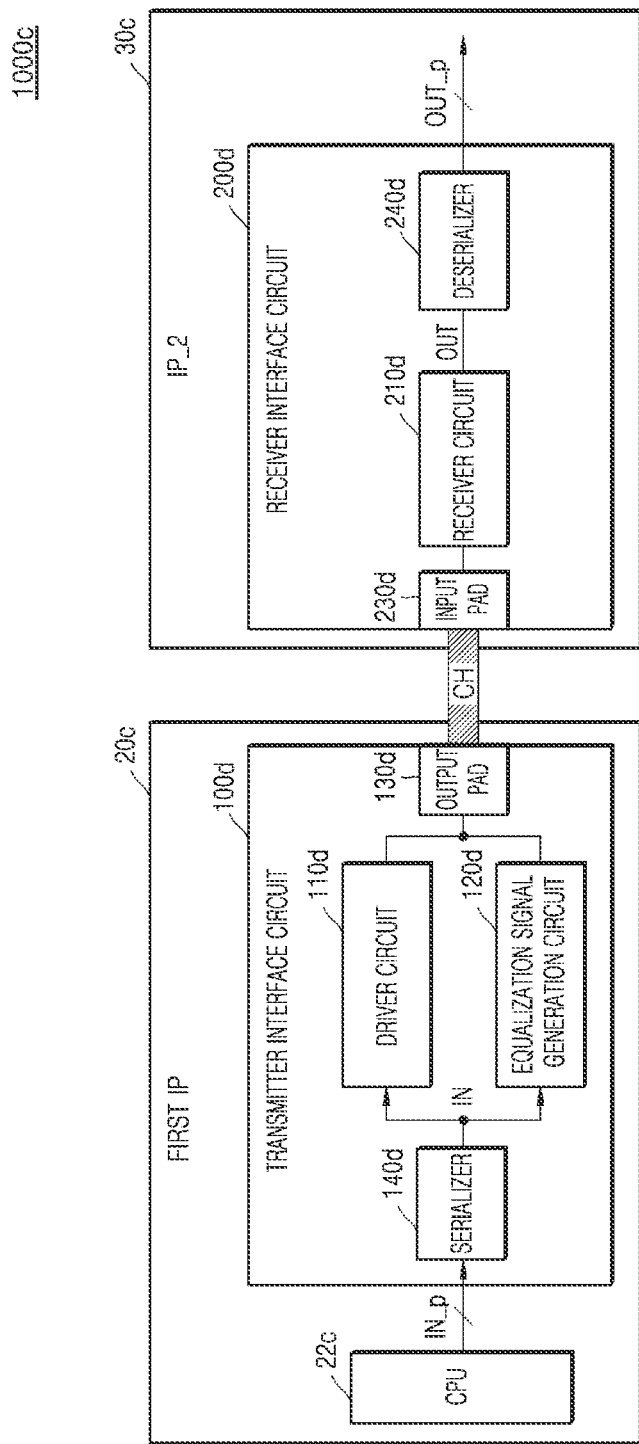

FIG. 10 is a block diagram of a system 1000c according to embodiments of the inventive concept.

Referring to FIG. 10, the system 1000c may include a first IP 20c and a second IP 30c. A transmitter interface circuit 100d—consistent with embodiments of the inventive concept—may be included in the first IP 20c, and a receiver interface circuit 200d may be included in the second IP 30c. The first IP 20c and the second IP 30c may be connected to each other through a channel CH and may transmit and receive a data signal using the transmitter interface circuit 100d and the receiver interface circuit 200d.

A CPU 22c may be included in the first IP 20c and may transmit the first input data signal IN_p, which has been parallelized, to the transmitter interface circuit 100d. A serializer 140c may serialize the first input data signal IN_p and transmit the first input data signal IN, which has been serialized, to a driver circuit 110d and an equalization signal generation circuit 120d. An output pad 130d may generate a second input data signal by combining an output signal of the driver circuit 110d with an output signal of the equalization signal generation circuit 120d and transmit the second input data signal to the second IP 30c through the channel CH. An input pad 230d may transmit the second input data signal to a receiver circuit 210d, and the receiver circuit 210d may transmit the second input data signal as the first output data signal OUT to a deserializer 240d. The deserializer 240d may parallelize the first output data signal OUT and transmit a parallelized result, i.e., the second output data signal OUT_p, to an internal block of the second IP 30c.

FIG. 11 is a block diagram illustrating a system 1000d according to embodiments of the inventive concept.

Referring to FIG. 11, the system 1000d may include a first IP 20d, a second IP 30d, and an interface circuit 10d. The interface circuit 10d may include first and second transmitter interface circuits 100e and 300e, first and second receiver interface circuits 200e and 400e, and first and second internal channels CH1 and CH2. The first transmitter interface circuit 100e may be connected to the first receiver interface circuit 200e via the first internal channel CH1, and the second transmitter interface circuit 300e may be connected to the second receiver interface circuit 400e via the second internal channel CH2.

The first transmitter interface circuit 100e, the first receiver interface circuit 200e, and the first internal channel CH1 may transmit an input data signal from the first IP 20d to the second IP 30d. The first transmitter interface circuit 100e may include an equalization signal generation circuit 120e, to which example embodiments are applied.

The second transmitter interface circuit 300e, the second receiver interface circuit 400e, and the second internal channel CH2 may transmit an input data signal from the second IP 30d to the first IP 20d. The second transmitter interface circuit 300e may include an equalization signal generation circuit 320e, to which example embodiments are applied.

In some embodiments, the first IP 20d, the first transmitter interface circuit 100e, and the second receiver interface circuit 400e may have been produced using a first-type production process, while the second IP 30d, the first receiver interface circuit 200e, and the second transmitter interface circuit 300e may have been produced using a second-type production process, different from the first-type production process.

Hence, the interface circuit 10d may include the first and second transmitter interface circuits 100e and 300e and the first and second receiver interface circuits 200e and 400e, which are produced using different-type production processes, yet nonetheless support signal communication between the first IP 20d and the second IP 30d. Here, one or both of the first-type and second-type production processes may include micro process technology. For example, the first-type production process may include a K nano process, and the second-type production process may include an N nano process.

Figure 12A:
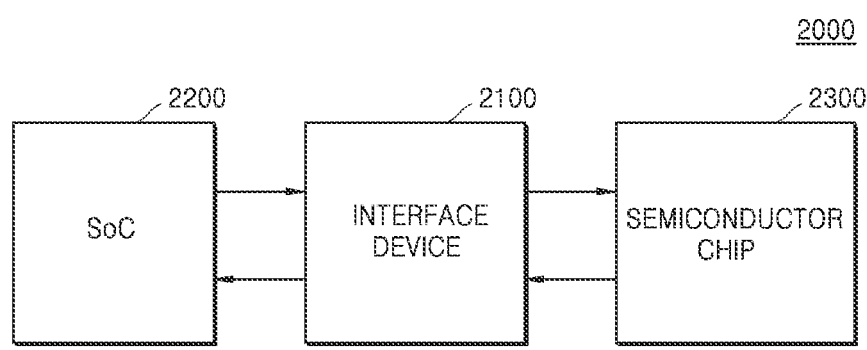

FIG. 12A is a block are diagram illustrating a system 2000 according to embodiments of the inventive concept, and FIG. 12B is a perspective view further illustrating in one example the semiconductor chip 2300 of FIG. 12A.

Referring to FIG. 12A, the system 2000 may include a system-on-chip (SoC) 2200, an interface device (or an interface chip) 2100 to which embodiments are applied, and a semiconductor chip 2300. In some embodiments, the SoC 2200 may be referred to as a processing device, and the semiconductor chip 2300 may be referred to as a memory device. The SoC 2200 may include an application processor and may function as a host. The SoC 2200 may include a system bus (not shown) according to a protocol having a certain standard bus specification and may include various IPs connected to the system bus.

A standard specification for the system bus may include an advanced microcontroller bus architecture (AMBA) protocol of Advanced RISC Machine (ARM) Ltd. Bus types of the AMBA protocol may include an advanced high-performance bus (AHB), an advanced peripheral bus (APB), an advanced extensible interface (AXI), AXI4, and AXI coherency extensions (ACE). Besides the above, other types of protocols such as uNetwork of SONICs Inc., CoreConnect of IBM, and open core protocol of OCP-IP's may be used.

Referring to FIG. 12B, the semiconductor chip 2300 may include high bandwidth memory (HBM) including first through eighth channels CH1 through CH8 each having an independent interface. The semiconductor chip 2300 may include a plurality of dies, e.g., a buffer die 2310 and a plurality of memory dies 2320 stacked on the buffer die 2310. For example, a first memory die 2321 may include the first channel CH1 and the third channel CH3, a second memory die 2322 may include the second channel CH2 and the fourth channel CH4, a third memory die 2323 may include the fifth channel CH5 and the seventh channel CH7, and a fourth memory die 2324 may include the sixth channel CH6 and the eighth channel CH8.

The buffer die 2310 may be connected to the interface device 2100 through conductive members, e.g., bumps or solder balls, formed on the outer surface of the semiconductor chip 2300. The buffer die 2310 may receive a command, an address, and data from the SoC 2200 through the interface device 2100 and may provide the command, the address, and the data to at least one of the first through eighth channels CH1 through CH8 of the memory dies 2320. The buffer die 2310 may provide data, which is output from at least one of the first through eighth channels CH1 through CH8 of the memory dies 2320, to the SoC 2200 through the interface device 2100.

The semiconductor chip 2300 may include a plurality of through silicon vias (TSVs) 2330 passing through the memory dies 2320. Each of the first through eighth channels CH1 through CH8 may be separated to the left and right sides. For example, the sixth channel CH6 of the fourth memory die 2324 may be separated into pseudo channels CH6a and CH6b, and the eighth channel CH8 of the fourth memory die 2324 may be separated into pseudo channels CH8a and CH8b. The TSVs 2330 may be between the pseudo channels CH6a and CH6b of the sixth channel CH6 and between the pseudo channels CH8a and CH8b of the eighth channel CH8.

The buffer die 2310 may include a TSV region 2316, a serializer/deserializer (SERDES) region 2314, and an HBM physical layer (PHY) interface, i.e., an HBM PHY region 2312. The TSVs 2330 for communication with the memory dies 2320 are formed in the TSV region 2316.

With the increase of the processing throughput of the SoC 2200 and the increasing demand for memory bandwidths, the SERDES region 2314 provides an SERDES interface according to Joint Electron Device Engineering Council (JEDEC) standards. The SERDES region 2314 may include a SERDES transmitter part, a SERDES receiver part, and a controller part. The SERDES transmitter part may include a parallel-to-serial circuit and a transmitter and may receive and serialize a parallel data stream. The SERDES receiver part may include a receiver amplifier, an equalizer, a clock and data recovery (CDR) circuit, and a serial-to-parallel circuit and may receive and parallelize a serial data stream. The controller part may include an error detection circuit, an error correction circuit, and registers such as first-in, first-out (FIFO) registers.

The HBM PHY region 2312 may include a physical or an electrical layer and a logical layer, which are provided for signals, frequency, timing, driving, detailed operation parameters, and functionality, which are required for efficient communication between the SoC 2200 and the semiconductor chip 2300. The HBM PHY region 2312 may perform memory interfacing such as selecting a row and a column corresponding to a memory cell, writing data to a memory cell, or reading data from a memory cell. The HBM PHY region 2312 may support features of an HBM protocol defined by JEDEC.

Example embodiments may be applied to the interface device 2100. The interface device 2100 may generate an equalization signal for suppressing a reflected wave generated by an internal channel of the interface device 2100 when the interface device 2100 transmits a data signal from the SoC 2200 to the semiconductor chip 2300 or transmits a data signal from the semiconductor chip 2300 to the SoC 2200. The interface device 2100 may include a transmitter/receiver interface circuit produced based on a production process of the SoC 2200 and a transmitter/receiver interface circuit produced based on a production process of the semiconductor chip 2300.

The interface device 2100 may interface such that data communication between the SoC 2200 and the semiconductor chip 2300 may be smoothly performed and may increase reception quality by reducing the influence of a reflected wave. As a result, the interface device 2100 may increase the overall performance of the system 2000.

While the inventive concept has been particularly shown and described with reference to certain embodiments thereof, it will be understood that various changes in form and detail may be made to these embodiments without departing from the spirit and scope of the following claims.

What is claimed is:

1. A transmitter interface circuit configured to receive a first input data signal and output a first output data signal, the transmitter interface circuit comprising:
    an output pad;
    a driver circuit configured to output a driving signal to the output pad by driving the first input data signal; and
    an equalization signal generation circuit configured to generate an equalization signal from the first input data signal and output the equalization signal to the output pad, wherein
    the equalization signal generation circuit is configured to be operated by a power voltage of a level higher than the driver circuit.

2. The transmitter interface circuit of claim 1, wherein the output pad is configured to output the first output data signal by summing the driving signal and the equalization signal.

3. The transmitter interface circuit of claim 1, wherein the output pad is connected to a channel for die-to-die (D2D) communication with a receiver interface circuit.

4. The transmitter interface circuit of claim 3, wherein the transmitter interface circuit being generated in a process different from the receiver interface circuit.

5. The transmitter interface circuit of claim 1, wherein the equalization signal generation circuit comprises:
    a pulse signal generation circuit configured to generate a pulse signal from the first input data signal; and
    a filtering circuit configured to generate the equalization signal by filtering a direct current (DC) component of the pulse signal.

6. The transmitter interface circuit of claim 5, wherein the pulse signal generation circuit is configured to generate the pulse signal by delaying the first input data signal by a target delay time or adjusting a width of the first input data signal according to a target width.

7. The transmitter interface circuit of claim 5, wherein the filtering circuit comprises a capacitor element and a resistance element that are connected in series.

8. The transmitter interface circuit of claim 1, wherein the driver circuit comprises:
    a pre-driver operated by a first power voltage; and
    a driver operated at a second power voltage of a level lower than the first power voltage.

9. A transmitter interface circuit configured to receive a first input data signal and output a first output data signal, the transmitter interface circuit comprising:
    an output pad;
    a driver circuit configured to drive the first input data signal to be output as a driving signal to the output pad;
    a pulse signal generation circuit configured to generate a first pulse signal by delaying the first input data signal or adjusting a width of the first input data signal; and
    a filtering circuit configured to generate an equalization signal by filtering a direct current (DC) component of the first pulse signal and output the equalization signal to the output pad, wherein
    the pulse signal generation circuit is configured to be operated by a power voltage of a level higher than the driver circuit.

10. The transmitter interface circuit of claim 9, wherein the pulse signal generation circuit further comprises:
    a variable capacitance circuit configured to delay the first input data signal by a target delay time in response to a first control signal; and
    a width adjustment circuit configured to adjust a width of the first input data signal according to a target width in response to a second control signal.

11. The transmitter interface circuit of claim 10, further comprising a plurality of pins configured to receive the first and second control signals from the outside.

12. The transmitter interface circuit of claim 10, wherein the output pad is connected to a channel for die-to-die (D2D) communication for a receiver interface circuit, and
    the first and second control signals are determined based on characteristics of the channel.

13. The transmitter interface circuit of claim 9, wherein the output pad is configured to sum the driving signal and the equalization signal to be output as the first output data signal.

14. The transmitter interface circuit of claim 9, wherein the driver circuit is connected in parallel to the pulse signal generation circuit and the filtering circuit that are connected in series.

15. An interface circuit comprising:
    a transmitter interface circuit configured to receive a first input data signal and output a first output data signal;
    a receiver interface circuit configured to receive the first output data signal; and
    an internal channel configured to transmit the first output data signal between the transmitter interface circuit and the receiver interface circuit, wherein:
    the transmitter interface circuit further comprises:
        a driver circuit configured to drive the first input data signal to generate a driving signal;

an equalization signal generation circuit configured to generate an equalization signal from the first input data signal, wherein the equalization signal generation circuit is configured to be operated by a power voltage of a level higher than the driver circuit; and an output pad configured to sum the driving signal and the equalization signal to be output as the first output data signal to the internal channel.

16. The transmitter interface circuit of claim 15, wherein the equalization signal generation circuit comprises:

a pulse generation circuit configured to generate a pulse signal from the first input data signal; and a filtering circuit configured to filter a direct current (DC) component of the pulse signal to generate the equalization signal.

17. The transmitter interface circuit of claim 16, wherein the equalization signal comprises an edge component of the pulse signal.

18. The transmitter interface circuit of claim 15, wherein the internal channel is configured to allow a symbol period of the first input data signal to be less than twice a flight time of the first output data signal from the output pad to an input pad of the receiver interface circuit.

19. The transmitter interface circuit of claim 15, wherein an output terminal of the driver circuit is connected to an output terminal of the equalization signal generation circuit.

* * * * *